United States Patent [19]
Takahashi et al.

[11] Patent Number: 6,112,937
[45] Date of Patent: Sep. 5, 2000

[54] APPARATUS AND METHOD FOR ALIGNING PARTS

[75] Inventors: Shigeki Takahashi; Nihei Kaishita, both of Omihachiman, Japan

[73] Assignee: Murata Manufacturing Co., Ltd., Nagaokakyo, Japan

[21] Appl. No.: 09/095,652

[22] Filed: Jun. 11, 1998

[30] Foreign Application Priority Data

Jul. 3, 1997 [JP] Japan .................................. 9-194873

[51] Int. Cl.⁷ ..................................................... B23Q 7/12
[52] U.S. Cl. ........................... 221/167; 221/277; 198/392
[58] Field of Search .................................... 221/277, 156, 221/167, 168; 198/392, 396, 383

[56] References Cited

U.S. PATENT DOCUMENTS

| 4,014,460 | 3/1977 | Bryan, Jr. . |
| 4,615,169 | 10/1986 | Wurmli .................... 221/277 |
| 5,145,051 | 9/1992 | Hoppmann .............. 198/392 |

FOREIGN PATENT DOCUMENTS

| 0 414 061 A1 | 2/1991 | European Pat. Off. . |
| 3303920 A1 | 8/1984 | Germany . |
| 3410 595 A1 | 9/1984 | Germany . |
| 8-143164 | 6/1996 | Japan . |

*Primary Examiner*—Kenneth W. Noland
*Attorney, Agent, or Firm*—Burns, Doane, Swecker & Mathis, LLP

[57] ABSTRACT

A part-aligning apparatus is simple in structure, causes less damage to chip parts, and operates well even if its chip discharge passage is clogged or overflows. The apparatus has a part-holding chamber for accommodating a number of chip parts. An arc-shaped chute groove is formed in the inner surface of the bottom of the part-holding chamber to orient the chip parts in a given direction and to guide the sliding chips. A gate port is formed at the lower end of the chute groove to pass the sliding chip parts in series out of the apparatus. The discharge passage is formed tangent to the chute groove to align the passed chip parts in a row and to deliver the chip parts in sequence. A swingable plate having a blade is mounted inside the part-holding chamber. This blade urges any chip part which is stopped in the gate port due to an abnormal orientation toward a direction different from the direction in which the chip parts are discharged, thus removing clogging.

16 Claims, 7 Drawing Sheets

APPARATUS AND METHOD FOR ALIGNING PARTS

This application corresponds to Japanese Patent Application No. 9-194873, filed on Jul. 3, 1997, which is hereby incorporated by reference in its entirety.

BACKGROUND OF THE INVENTION

The present invention relates to an apparatus and method for aligning a multiplicity of chip parts in a row and delivering the chip parts in sequence.

Known part-aligning apparatus of the above-mentioned kind include bulk feeders and vibrating ball feeders. Bulk feeders are roughly classified into pneumatically driven bridge-breaking type feeders and bridge-breaking type feeders which use an upward-thrusting pin in operation. In the case of the pneumatically driven type of feeder, it is difficult to adjust the amount and direction of airflow. In the case of the upward-thrusting pin type of feeder, whenever an operation is performed, the pin impacts the parts and so the parts tend to be easily scratched or damaged. In both types, every chip part is forced toward a funnel-like exit. Therefore, if a bridge-breaking operation is performed once, the bridge may be immediately restored. As a consequence, the efficiency at which parts are aligned is low. In the case of the vibrating ball type of feeder, bridges are not readily formed. However, this equipment is expensive. Also, unwanted vibration is easily transmitted to other apparatus. Furthermore, a large space is required for this type of equipment.

A part-aligning apparatus free of these problems is proposed in Japanese Unexamined Patent Publication No. 143164/1996. This apparatus comprises a cylindrical stocker for holding chip parts, an annular body disposed on the outer surface of the outer curved wall of the stocker, and a rotary disk having an annular indexing portion. This indexing portion is rotatably disposed in the gap between the outer curved wall of the stocker and the inner surface of the annular body. The indexing portion has a plurality of chip-holding recesses for individually seizing the chip parts. A chip discharge hole in communication with a chip storage portion is formed near the bottom of the outer wall of the stocker and in the path over which the chip-holding recesses are moved. In this case, movement is provided only by rotary motion, and accordingly, it is easier to make an adjustment. The chip parts are damaged less. In addition, the apparatus can be easily built to have a smaller size.

The above-described part-aligning apparatus requires at least the stocker, the annular body, and the rotary disk. Therefore, this apparatus is complex in structure and often breaks down. It is necessary that the rotary disk has chip-holding recesses arranged circumferentially, the recesses conforming to the shapes of the individual chip parts. In order to align micrometer chip parts having a length of about 1 mm long, the chip-holding recesses must be processed in correspondingly small size. Hence, the apparatus is very complex in structure and laborious to machine, thus increasing the cost.

The chip parts are held in series (e.g., the chips are held adjacent to each other in a line) by the chip-holding recesses in the indexing portion of the rotary disk. As the disk turns, the chip parts are forced toward a chute. Therefore, if the chute becomes clogged or overflows for some reason, a chip part subsequently fed in will be caught in the chute. As a result, the chip part may be damaged or the apparatus itself may break down. At this time, therefore, it is necessary to quickly stop the rotary disk using a "full occupation" sensor.

SUMMARY OF THE INVENTION

It is an object of the present invention to provide a part-aligning apparatus that is simple in structure, less damaging to chip parts to be aligned, and functions well even if the chip discharge passage becomes clogged or overflows.

It is another object of the invention to provide a method of aligning chip parts without being affected by clogging of the chip discharge passage or by overflow of the chute such that the chip parts are less damaged than heretofore.

The above objects are achieved in accordance with the teachings of the invention by an exemplary apparatus comprising: a part-holding chamber for accommodating a multiplicity of chip parts; a chute groove formed at least in the inner surface of the bottom of the part-holding chamber and acting to orient the chip parts in a given direction and to cause the chip parts to slide in a downward direction, a gate port formed at the lower end of the chute groove and permitting those chip parts to pass in succession which slide downward in a given orientation along the chute groove; a discharge passage for aligning the chip parts which have passed through the gate port in a row and for delivering the parts; and a swingable plate having a front end portion passing over the gate port. The swingable plate is swung to urge any chip part halted in the gate port due to an abnormal orientation toward a direction different from a direction in which the chip parts are delivered, thus removing the clogging.

The chip part introduced into the part-holding chamber is kept on the inner surface of the bottom of the parts-holding chamber by gravity and falls into the chute groove. Since the chute groove is formed having a given width, the chip part falls into the chute groove and is oriented in a given direction. For example, where the chip part assumes a boxlike shape, i.e., the length is greater than the width and the height, if the width of the chute groove is set slightly larger than the width and the height of the chip part and less than the length, the chute groove can align the chip parts in the vertical direction. Each chip part falling into the chute groove is slid downward by gravity and brought to the gate port. If the chute part is in a correct orientation (e.g., a lateral orientation), the chip part passes through the gate port intact. Then, it is discharged into a discharge passage. However, if a chip part positioned in an abnormal orientation (e.g., an upright orientation) reaches the gate port, the part clogs the port. Since the swingable blade passes over the gate port at regular intervals, the chip part halted at the gate port is urged by the swingable plate toward at direction different from the direction in which chip parts are discharged. The result is that the chip part is removed from the gate port or modified to assume a normal orientation. This removes the clogging. Hence, the chip parts located behind the previously clogging chip part are allowed to be discharged from the gate port.

The chip part halted at the gate port may be urged by the blade in a direction that is opposite to, or at an angle to, the discharge direction. Any direction may be used as long as the clogging can be removed.

When the angle through which the swingable plate swings becomes large, the front edge of the swingable plate swings in a forward direction to thereby remove clogging and then swings in a rearward direction. At this time, the chip part is sandwiched between the rear edge of the swingable plate and the gate port. This creates the danger of damage to the chip part. Accordingly, it is desired to shape the swingable plate into a sector and to set the angle through which the plate swings to such a value that the rear edge does not pass over the gate port. In this case, when the swingable plate swings in the forward direction, the outer edge of the swingable plate is constantly moving over the gate port and so any other chip part in an incorrect orientation does not fit into the gate port. This prevents any chip part from being held between the gate port and the rear edge of the swingable plate.

Where an inclined surface is formed in at least one side surface of the part-holding chamber to cause chip parts to slide toward the chute groove, the falling of the chip parts into the chute groove is rendered smooth. Hence, the alignment efficiency is improved.

In one embodiment of the invention, the part-holding chamber comprises a drum body and a cover member. The chute groove is an arc-shaped groove formed in the inner surface of the drum body. The discharge passage is formed so as to be tangential to the arc-shaped chute groove. The chute port is formed at the junction of the chute groove and the discharge passage. This makes the movement of the chip part very smooth in traveling from the chute groove into the discharge passage through the gate port.

In another embodiment of the invention, plural chute grooves are formed in parallel in the inner surface of the part-holding chamber, and the gate port and the discharge passage are formed at the lower end of each chute groove. In this case chip parts are aligned with improved efficiency.

The present invention is adapted for alignment of chip parts in a boxlike form, i.e., where the length is greater than the vertical and lateral dimensions. The invention can also be applied to alignment and delivery of cubic chip parts and cylindrical chip parts.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 1:
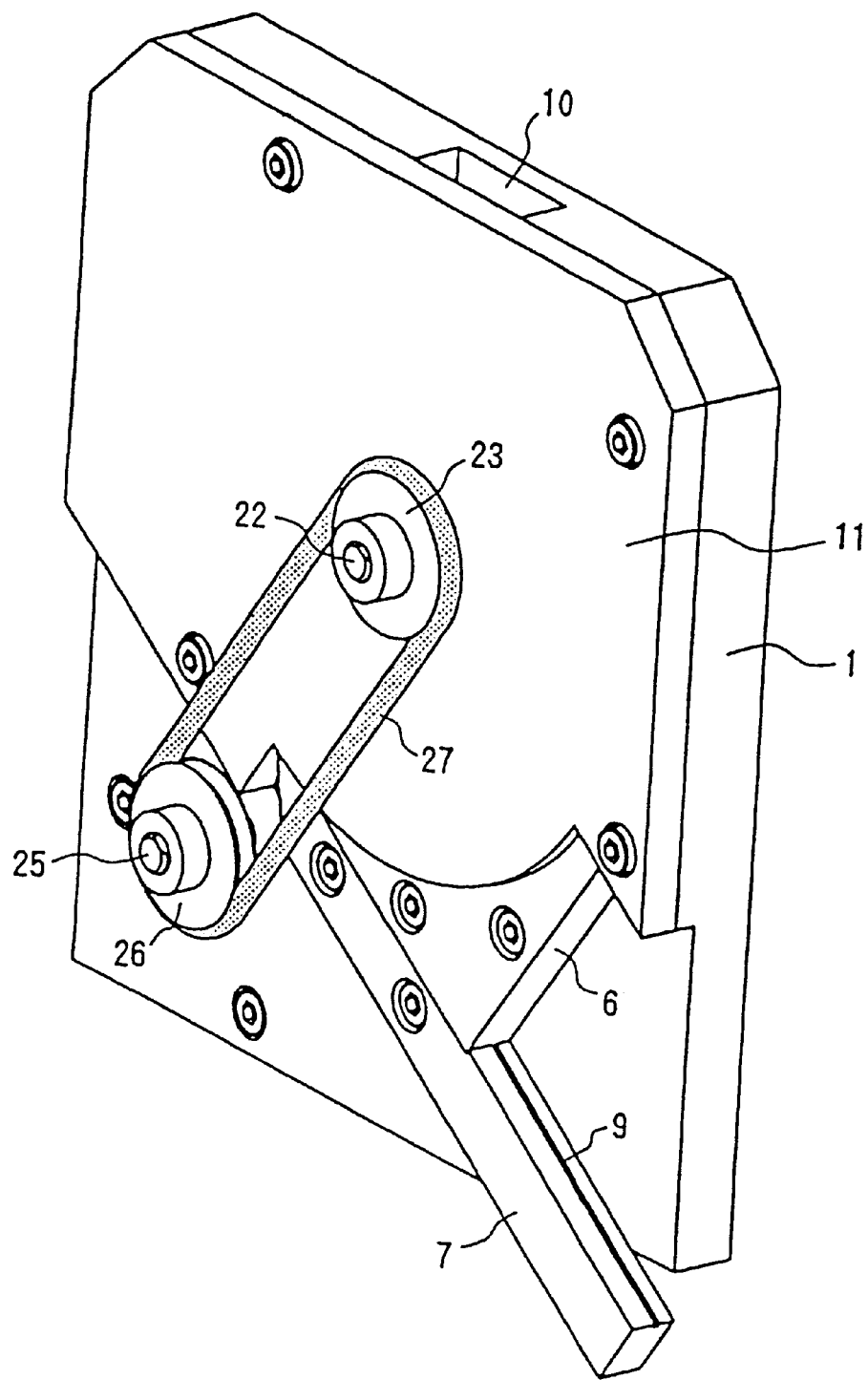
FIG. 1 is a perspective view of a part-aligning apparatus in accordance with one exemplary embodiment of the present invention.
Figure 2:
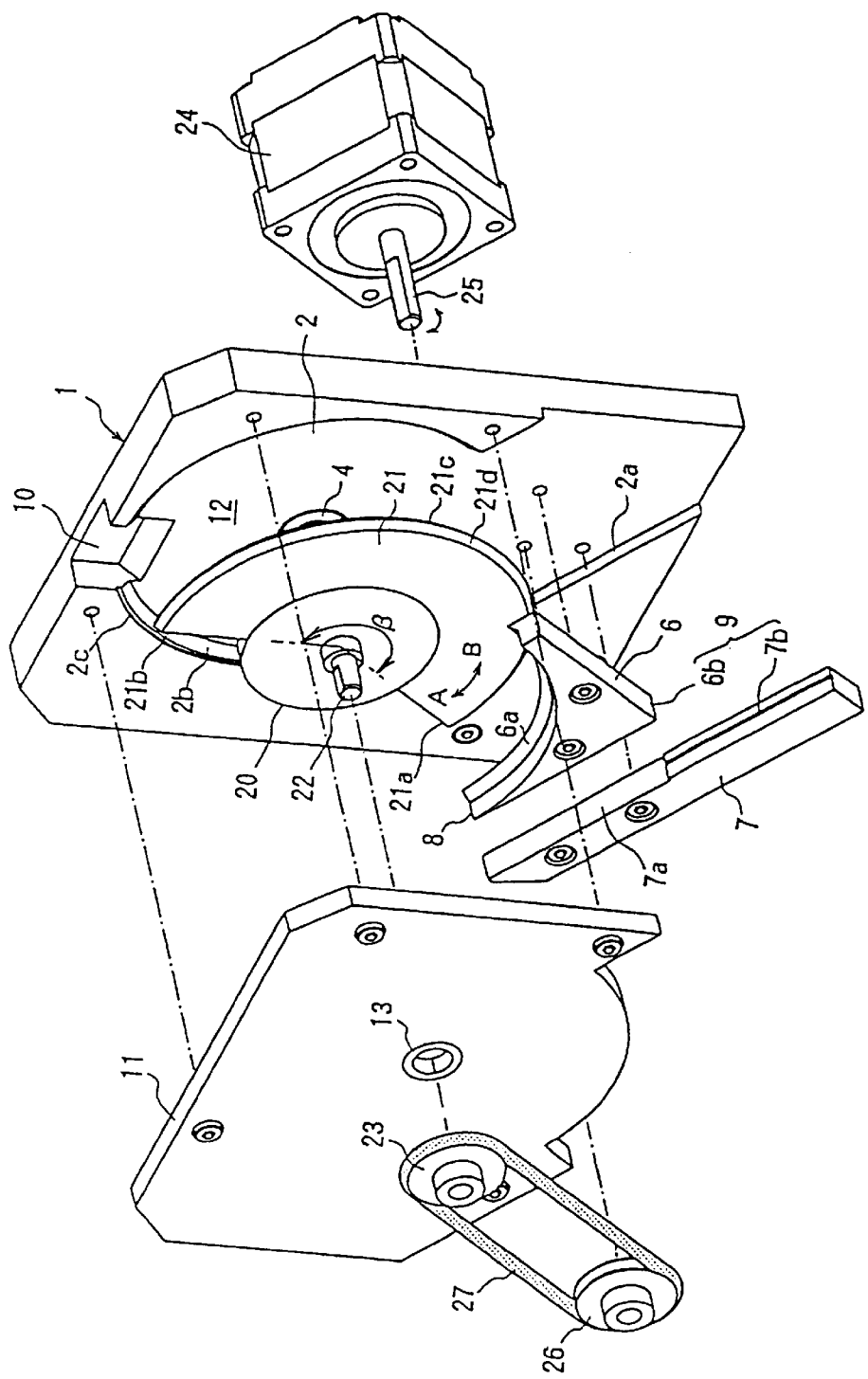
FIG. 2 is an exploded perspective view of the part-aligning apparatus shown in FIG. 1.

A part-aligning apparatus in accordance with the present invention is shown in FIGS. 1–7. This apparatus aligns chip parts, such as the exemplary chip part shown in FIG. 8. In FIG. 8, the chip part C has a boxlike form and has a height of H, a width of W, and a length of L (L>H, L>W, and H≈W). Electrodes Ca and Cb are formed at longitudinal ends, respectively, of the chip part C.

A drum body 1 is made of a hard plate placed vertically and provided with a substantially circular recess 2 in its surface. A bearing 4 is mounted in the center of the recess. An arc-shaped stepped surface 2c is formed in the inner surface of the recess 2. The width of this stepped surface 2c is equal to the sum of the width W of each chip part C and a certain clearance. The depth of the stepped surface 2c is equal to the sum of the height H of each chip part and a certain clearance. This stepped surface 2c cooperates with the inner surface 11a of a cover 11 (described later) to form a chute groove 5.

The recessed portion 2 has a lower portion extending over a certain angular range, forming a cutout 2a. A first block 6 is screwed or otherwise fixed to this cutout 2a. A continuous arc-shaped surface is formed across both recessed portion 2 and block 6. Continuous tapering surfaces 2b and 6a are formed in the inner surface of the recessed portion 2 and in the inner surface of the block 6, respectively In particular, the tapering surface 2b formed in the inner surface of the recessed portion 2 is tilted toward the chute groove 5 and acts to guide the chip part C toward the chute groove 5.

Figure 3:
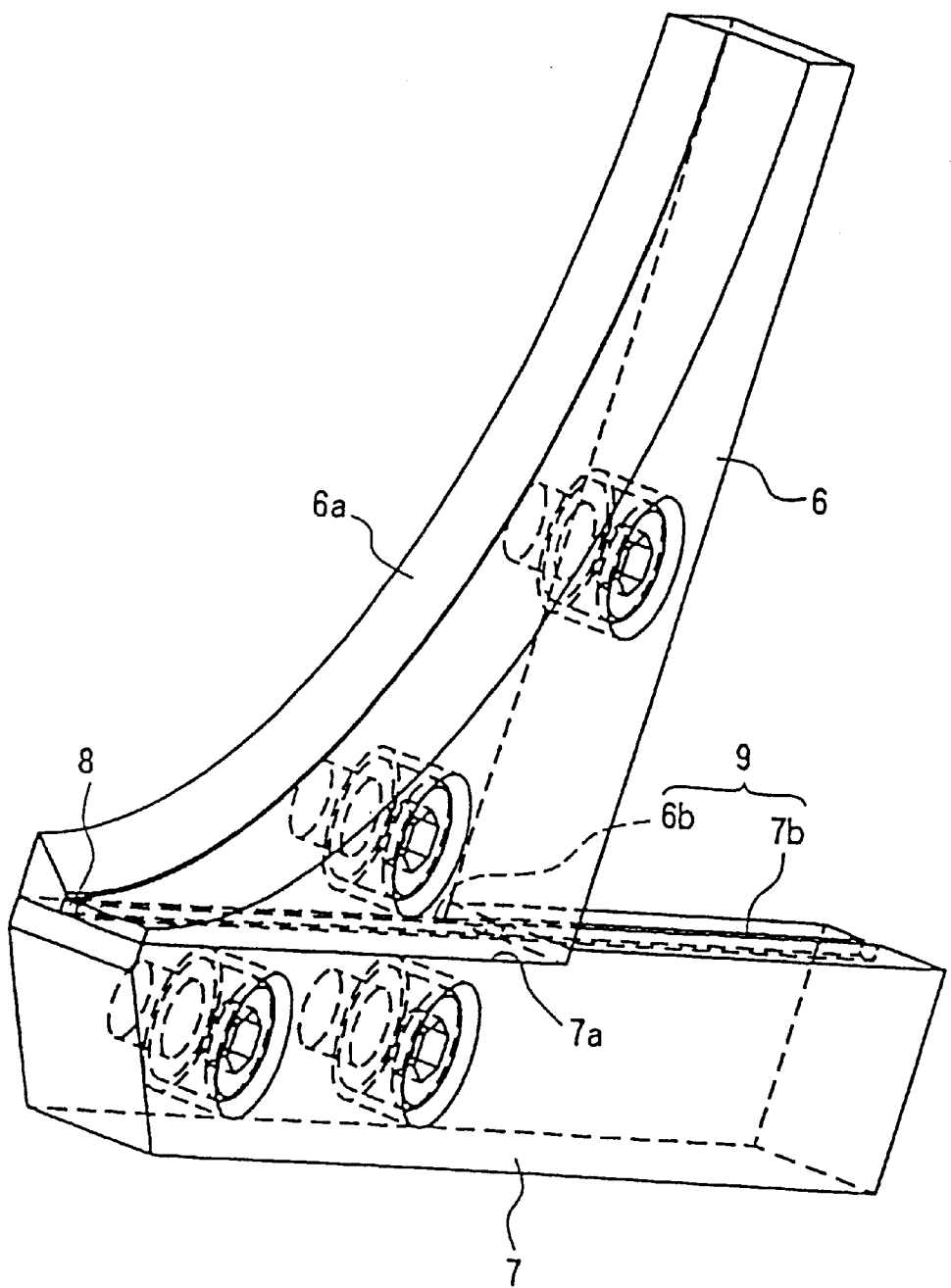
FIG. 3 is an enlarged perspective view of the first and second blocks of the part-aligning apparatus shown in FIGS. 1 and 2.

A second block 7 is fixed in the cutout 2a of the recess 2 adjacent to the bottom surface of the first block 6. A first groove 6b is formed in the bottom surface of the first block 6, as shown in FIG. 3. A flat surface 7a closing off the bottom surface of the first block 6 and a second groove 7b continuous with the first groove 6b are formed in the top surface of the second block 7. The first block 6 and the second block 7 are fixed to the drum body 1, forming a gate port 8 and a discharge passage 9 that are placed in communication with the chute groove 5 through the two grooves 6b and 7b, respectively. The discharge passage 9 is tangent to the arc-shaped chute groove 5 and tilted downward at the slide angle α shown in FIG. 4. Preferably, this slide angle α is set within a range given by the approximate relationship 30°≦α<90°. The gate port 8 is formed at the junction of the arc-shaped chute groove 5 and the tangential discharge passage 9. The gate port 8 is so dimensioned that the chip parts C can pass one by one in the longitudinal direction. That is, the height and width are slightly larger than H and W and less than L. The gate port 8 is equal in width to the chute groove 5. A part introduction port 10 in communication with the recess 2 is formed in the top surface of the drum body 1.

Figure 5:
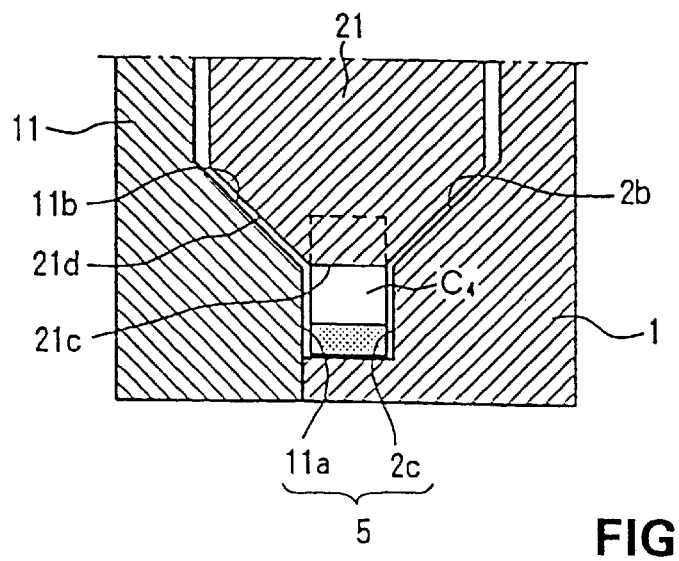
FIG. 5 is a cross-sectional view taken along line X—X of FIG. 4.

The aforementioned cover 11 for closing the recess 2 is fixedly mounted to the surface of the drum body 1. A part-holding chamber 12 for accommodating a multiplicity of chip parts C is formed between the cover 11 and the drum body 1. Preferably, the cover 11 is made of a transparent material such as acrylic resin to permit visual verification of the quantity of the chip parts C inside the chamber 12. The inner surface 11a of the cover 11 is opposite to the stepped surface 2c of the drum body 1, and the aforementioned chute groove 5 is formed between the cover and the drum body. A bearing 13 is mounted in the center of the cover 11 in an opposite relation to the bearing 4 of the drum body 1. A tapering surface 11b opposite to the tapering surfaces 2b and 6a is formed in the inner surface of the cover 11, as shown in FIG. 5.

A swingable plate 20 is swingably mounted in the part-holding chamber 12 and has a radially protruding sectorial blade 21. This blade is so dimensioned that its outer edge 21c passes just over the gate port 8 and over the chute groove 5. Therefore, when the swingable plate 20 swings in the direction A, the front edge 21a of the blade 21 can remove the chip part C clogging the gate port 8. In this embodiment, the blade 21 has a thickness substantially equal to the width of the part-holding chamber 12. The gap between both sides of the blade 21 and the inner surface of the part-holding chamber 12 is less than the minimum dimension of chip parts. Therefore, no chip part enters between the blade 21 and the part-holding chamber 12. A tapering surface 21d (see FIG. 5) close to the tapering surfaces 2b, 6a, and 11b is formed at the outer edge 21c of the blade 21. This eliminates the possibility that a chip part is squeezed between the part-holding chamber 12 and the blade 21.

The swingable plate 20 has a central shaft 22 swingably held by the bearings 4 and 13 mounted in the drum body 1 and the cover 11, respectively. The central shaft 22 has a front end portion protruding forward from the cover 11. A follower pulley 23 is mounted to the protruding end. A swinging motor 24 is mounted to the rear side of the drum body 1 and has a rotating shaft 25 that extends through the drum body 1 and is fitted over a driving pulley 26 disposed on the front side. A belt 27 is provided to connect the driving pulley 26 and the follower pulley 23. The swingable plate 20 can be swung via the driving pulley 26, the belt 27, and the follower pulley 23 by reciprocating the rotating shaft 25 in the directions A and B. The angle through which the swingable plate 20 swings is defined by a certain maximum permissible angle (e.g., about 90°) by a stopper mechanism (not shown). This angle is set considerably smaller than the center angle β (e.g., about 215°) of the sectorial blade 21.

The method of driving the swingable plate 20 is not limited to the aforementioned method using the belt 27. Of course, the rotating shaft 25 of the motor 24 may be directly connected to the shaft 22 of the swingable plate 20 to drive the shaft 22.

Figure 4:
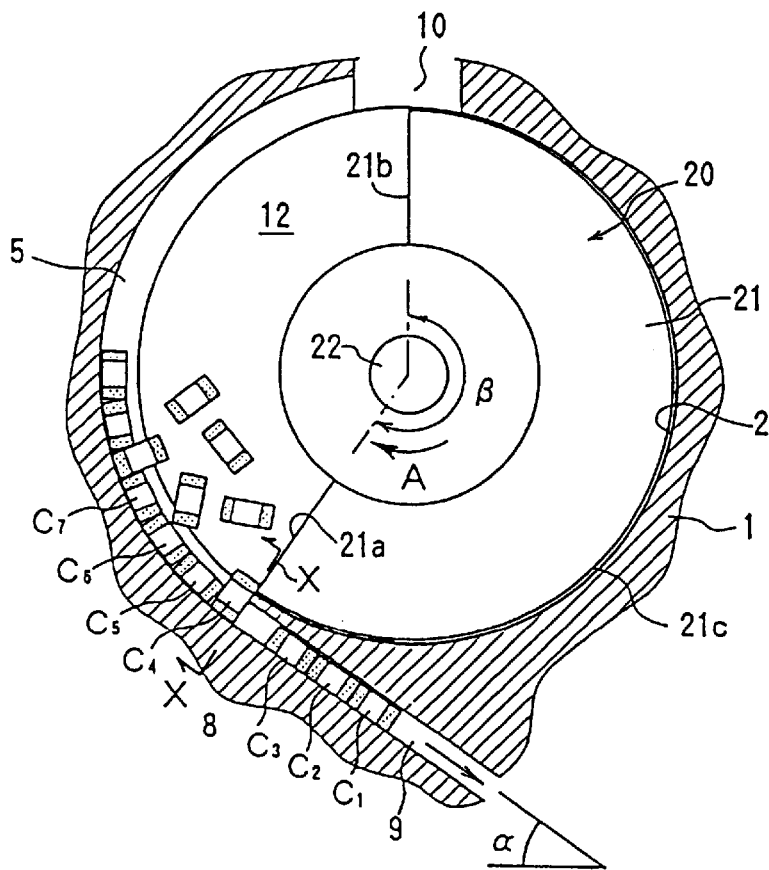
FIG. 4 is a cross-sectional view illustrating a first stage of an operation for removing clogging in a part-aligning apparatus in accordance with the invention.

The operation of the part-aligning apparatus of the construction described above is next described by referring to FIGS. 4–7. First, the chip parts C are introduced into the part-holding chamber 12 from the part introduction port 10. The chip parts C are collected in the chute groove 5 by the tapering surfaces 2b and 11b formed in tie drum body 1 and the cover 11, respectively. The width of the chute groove 5 is equal to the sum of the width W of each chip part C and the given clearance. The depth of the chute groove 5 is equal to the sum of the height H and a certain clearance. This prevents the chip part C from being oriented in a cross-wise direction in the chute groove 5. Chip parts $C_1$–$C_3$ sliding down the chute groove 5 are vertically aligned and so they pass through the gate port 8 as shown in FIG. 4 without difficulty. Then, the chip parts pass through the discharge passage 9 and are delivered. On the other hand, a part $C_4$ sliding downward through the chute groove 5 in an elevated orientation cannot pass through the gate port 8 and thus clogs it. Consequently, the following array of parts $C_5$–$C_7$ cannot pass through the gate port 8, producing clogging.

In this condition, if the swingable plate 20 rotates in the forward direction, i.e., in the direction of the arrow A, the chip part pushed by the front edge 21a of the blade 21 dislodges and "throws down" the part $C_4$ in a direction opposite to the direction in which chip parts are discharged as shown in FIG. 4, thus opening the gate port 8. At this time, the load imposed on the part $C_4$ comprises only the weight of the parts $C_5$–$C_7$ following (e.g., on top of) the part $C_4$, and thus almost no restricting force acts on the part $C_4$ except for gravity. Therefore, the part $C_4$ can be easily removed or thrown sideways without overloading it. As a consequence, the following parts $C_5$–$C_7$ including the part $C_4$ can be discharged from the gate port 8.

If the swingable plate 20 is swung further in the direction A, the front edge 21a of the blade 21 carries the chip parts which have not fallen in the chute groove 5 in an upward direction and elevates them. Thus, the chip parts inside the par-holding chamber 12 are stirred. Hence, the bridge (e.g., the blockage) can be removed. Furthermore, the top of the chute groove 5 is skimmed by the outer edge 21c of the blade 21. Therefore, chip parts which are properly aligned in the chute groove 5 will not contact the blade; otherwise, sliding movement would be impeded. The chip parts slide in a downward direction as a linear array along the chute groove 5, the gate port 8, and the discharge passage 9. As a consequence, alignment and delivery can be performed efficiently.

Figure 6:
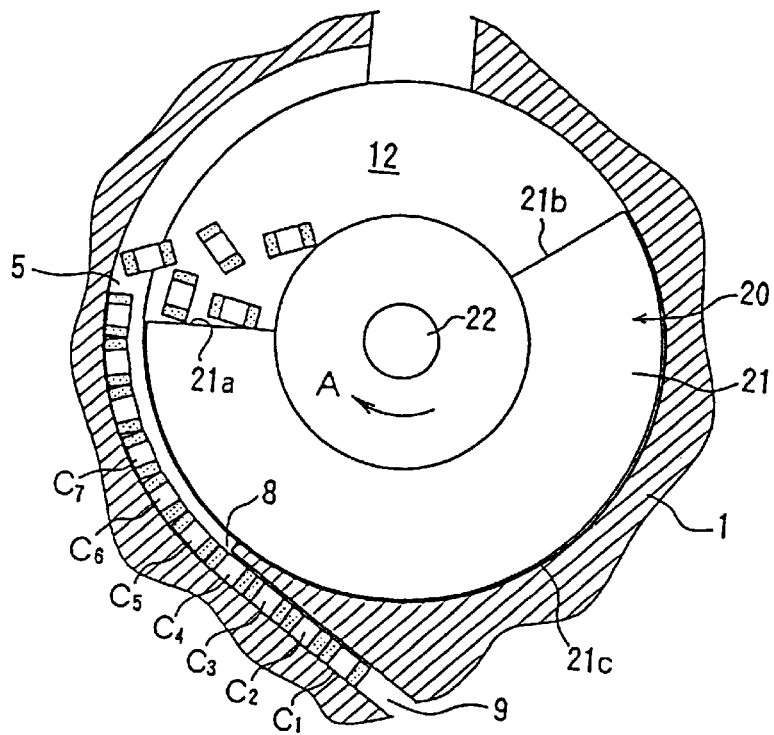
FIG. 6 is a cross-sectional view illustrating a second stage of an operation for removing clogging in a part-aligning apparatus in accordance with the invention.

FIG. 6 shows the exemplary front limit position of the swinging movement. Even at this limit position, the top of the gate port 8 is covered by the outer edge 21c of the blade 21. That is, when the sectorial blade 21 is swinging in the direction A, its rear edge 21b does not pass over the gate port 8. The outer edge 21c of the blade 21 is kept over the gate port 8. Accordingly, during the swinging movement in the direction A, any chip part in an incorrect orientation will not fall into the gate port 8. If the blade 21 then swings in the rearward direction, that is, in the direction B, no chip part will be held between the rear edge 21b of the blade 21 and the gate port 8.

Figure 7:
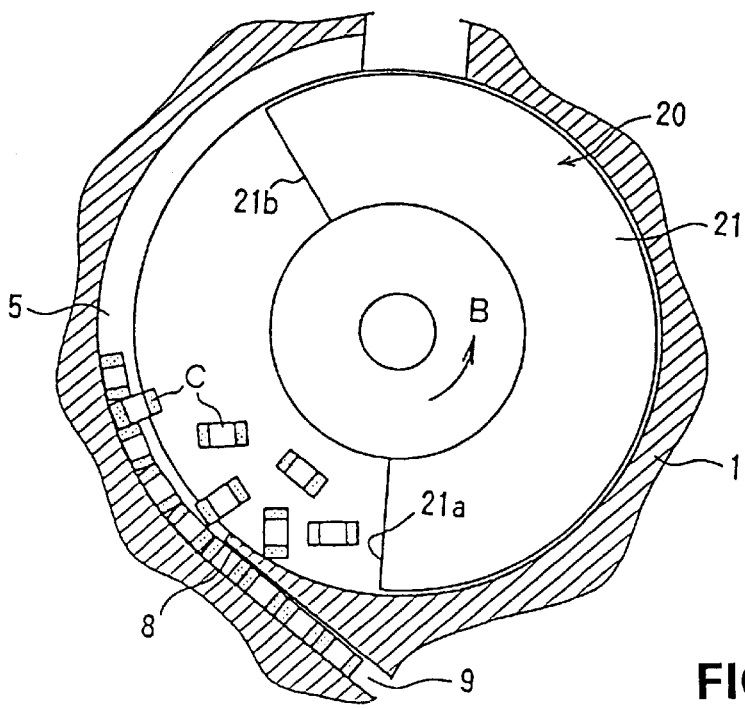
FIG. 7 is a cross-sectional view illustrating a third stage of an operation for removing clogging in a part-aligning apparatus in accordance with the invention.
Figure 8:
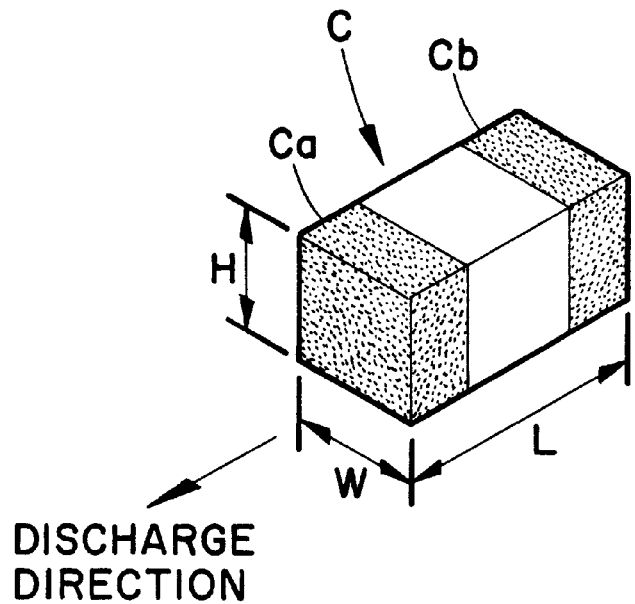
FIG. 8 is a perspective view of one example of a chip part.

After removing the clogging, the swingable plate 20 swings in a rearward direction, i.e., in the direction of the arrow B, arriving at the state shown in FIG. 7. The chip part C elevated by the front edge 21a of the blade 21 thus drops due to gravity. This promotes chip parts falling into the chute groove 5. FIG. 7 shows an exemplary rearward limit position of the swinging movement of the blade 21.

Where the center angle β of the blade 21 is small (e.g., β=90°), chip parts stay behind the swingable plate 20 (on the opposite side of the chute groove 5). These chip parts will not fall into the chute groove 5. Accordingly, the center angle β of the blade 21 is preferably set so that the rear edge 21b of the blade 21 is vertical or slightly tilted forward in the rear limit position of the swinging movement shown in FIG. 7. In this manner, the retention of chip parts behind the swingable plate 20 can be eliminated. Accordingly, all of the chip parts in the part-holding chamber 12 can be caused to fall into the chute groove 5.

As discussed above, the dimensions of the chute groove 5 formed between the drum body 1 and the cover 11 are used to select the orientation of parts with respect to their height and the width (H, W) dimensions. The gate port selects the orientation of the parts with respect to their length (L) dimension. Hence, the alignment efficiency is much higher than that of known bulk feeders. Furthermore, the swingable plate 20 can be swung slowly, since the rate at which the chip parts are delivered is not readily affected by the swinging speed of the swingable plate 20. In this case, the parts are less damaged. In addition, the apparatus is quiet in operation.

If the number of chip parts remaining in the part-holding chamber 12 is made fewer, chip parts fall into the chute groove 5 at a decreased rate. However, the chip parts remaining in the part-holding chamber 12 can all be expelled, since the front edge 21a of the blade 21 forces the chip parts staying on the inner surface of the first block 6 toward the chute groove 5. If a large number of chip parts are introduced into the part-holding chamber 12, their load acts on the chip parts aligned near the gate port 8, producing the possibility that movement of the chip parts may be impeded. However, the blade 21 may be made to pass by the gate port 8 at regular intervals and remove the restriction due to the load. Consequently, the chip parts can pass through the gate port 8 smoothly.

In the present invention, each chip part slides down the chute groove 5 by it own weight and is not restricted, unlike other known techniques. Therefore, if the discharge passage 9 becomes clogged or overflows, it is unlikely that the chip parts will be damaged or that the apparatus breaks down. In particular, if the discharge passage 9 becomes clogged or overflows, the chip part C simply stays in the chute groove 5. In other words, the part is not pushed from the rear side. The blade 21 simply moves in the direction opposite to the direction in which the chip part falls. Therefore, chip parts which are not initially aligned are simply pushed back in an upward direction. Hence, the chip parts are not overloaded. That is, when the discharge passage 9 becomes clogged or overflows, no problems occur if the swingable plate 20 is kept swinging as necessary.

Figure 9:
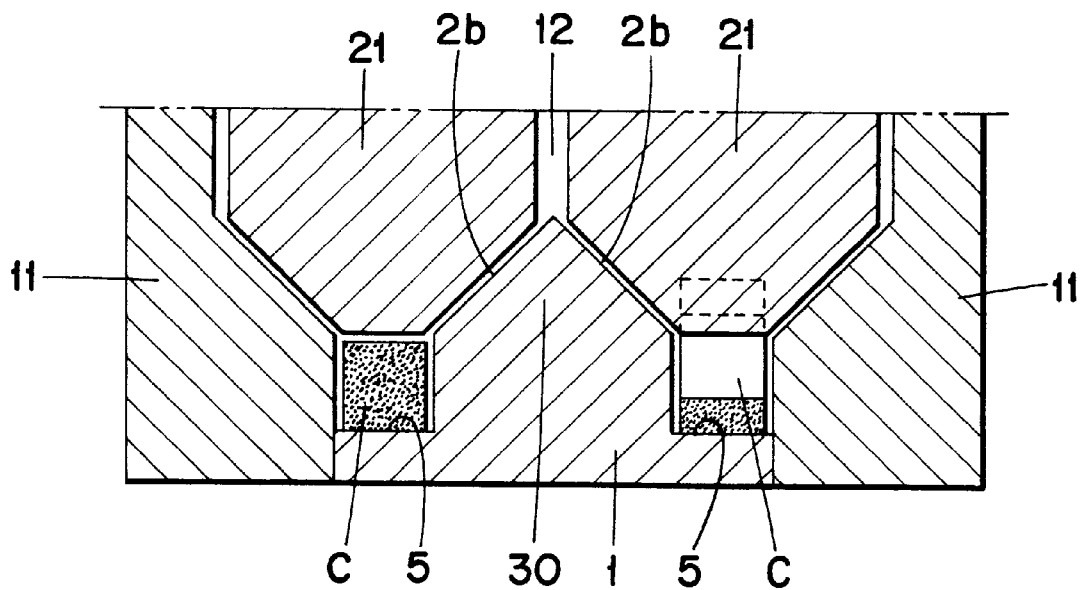
FIG. 9 is a cross-sectional view of another exemplary part-aligning apparatus in accordance with the invention.

Referring next to FIG. 9, there is shown another exemplary part-aligning apparatus in accordance with the present invention. Note that like components are indicated by like reference numerals in various figures and that those components which have been already described will not be described again below.

In this embodiment, two covers 11 are mounted to the opposite sides, respectively, of the drum body 1. Two chute grooves 5 are formed in the inner surface of the drum body 1. This drum body 1 is substantially cylindrical and has ports at its front and rear sides. An annular portion 30 protrudes between the plates 11. Tapering surfaces 2b tilted toward the chute groove 5 are formed on both sides of the protruding portion 30. A gate port and a discharge passage (none of which are shown) extend continuously at the lower end of each chute groove 5. In the embodiment described first, only one part-holding chamber 12 is formed. In this embodiment shown in FIG. 9, there are two chute grooves 5 and two blades 21. This improves the efficiency at which the chip parts C are aligned.

Figure 10:
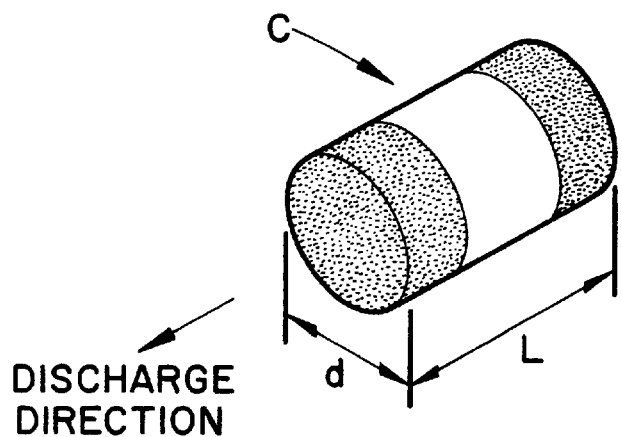
FIG. 10 is a perspective view of another example of a chip part.

In the above embodiment, the exemplary boxlike chip part C having almost identical width W and height H and a larger length L was considered. The aforementioned part-aligning apparatus can also align cylindrical chip parts C having a diameter d (effectively defining the W and H dimensions) and a length L (L>d) as shown in FIG. 10. The apparatus can also align cylindrical chip parts whose diameter d is equal to the length L, and also chip parts whose diameter d is greater than the length L.

Figures 11A, 11B:
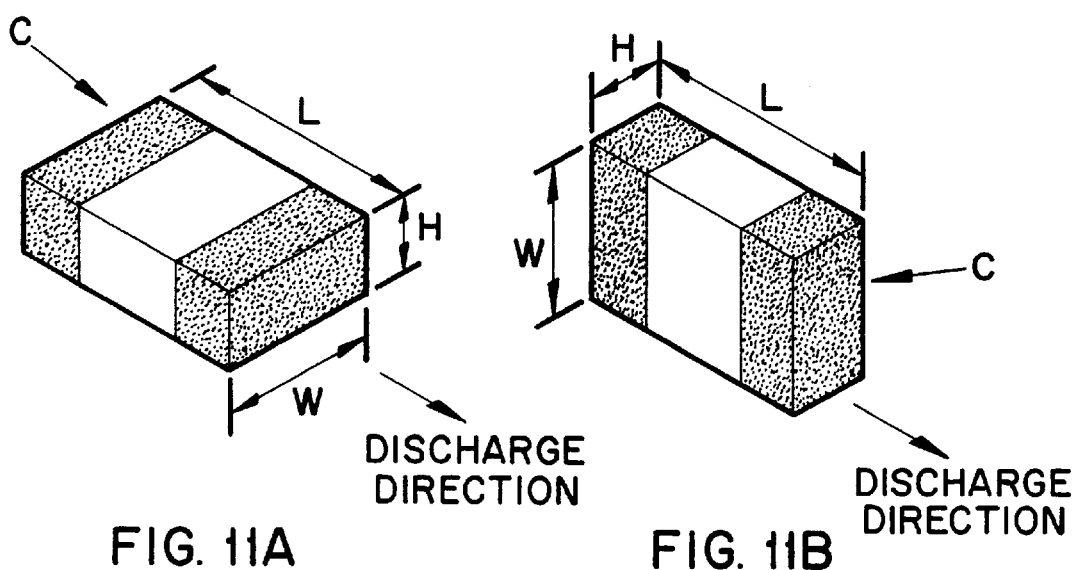
FIG. 11 is a perspective view of a further example of a chip part.

It is also possible to align boxlike chip parts C whose width W and height H are different from each other (e.g., L>W>H), as shown in FIGS. 11(A) and 11(B). These parts can be passed through the gate port 8 in a lateral orientation as shown in FIG. 11(A) by setting the width of the chute groove 5 greater than W and less than L and setting the height of the gate port 8 greater than H and less than W. The parts (an be passed through the gate port 8 even in a vertical orientation as shown in FIG. 11(B) by setting the height of the gate port 8 greater than W and less than L. Furthermore, the apparatus can align cubic chip parts whose W, H, and L dimensions are the same, in addition to the aforementioned chip parts whose L is greater than W and H.

Of course, the invention is not limited to the above embodiments. In the above embodiments, the blade 21 of the swingable plate 20 is shaped into a sector. The shape of the blade is not limited to this embodiment, however.

In the embodiments described above, the center of rotation of the swingable plate 20 is coaxial with the arc-shaped chute groove 5, and the blade 21 moves along the chute groove 5. It is only desirable that the blade 21 pass immediately over the gate port 8. Hence, the same effect can be achieved by making the center of rotation of the swingable plate 20 off the center of curvature of the chute groove 5. In this case, the swingable plate 20 can be miniaturized.

In the embodiments described above, the cover is mounted to the drum body, thereby forming a chute groove between the cover and the drum body. The invention is not limited to this structure. The drum body may be used to solely form the chute groove. Furthermore, the inclined surfaces (tapering surfaces) for causing the chip parts to slide toward the chute groove are not required to be formed on both sides of the chute groove. Only one inclined surface suffices. Moreover, the chute groove in accordance with the invention is not required to be arc-shaped. It may also be rectilinear and inclined. Accordingly, it is not required that the part-holding chamber be shaped like a drum.

As can be understood from the description provided thus far, in the present invention, chip parts are caused to fall into a chute groove, aligned in a line, and passed through the gate port. In this manner, the chip parts can be supplied in a given orientation. Therefore, the part-holding chamber is made very simple in structure. Also, the apparatus rarely breaks down. Each chip part is made to slide along the chute groove by its own weight instead of restricting the chip parts by applying force thereto. Then, the chip parts are discharged from the gate port. Consequently, the chip parts are prevented from being overloaded. No problems will occur even if the discharge passage is clogged or overflows.

Even if the gate port is clogged with a chip part, the clogging can be removed by forcing this part, by means of the blade of the swingable plate, toward a direction different from the direction in which chip parts are discharged. As a consequence, the chip parts are less damaged. The part yield can thereby be improved.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A part-aligning apparatus comprising:
   a part-holding chamber for accommodating a number of chip parts, said part-holding chamber having a bottom having an inner surface;
   at least one chute groove formed at least in the inner surface of the bottom of said part-holding chamber and acting to orient chip parts in a given direction, wherein said chip parts slide successively downward in said chute groove;
   at least one gate port formed at the lower end of said chute groove and permitting said chip parts sliding downward in a given orientation along said chute groove to successively pass therethrough;
   at least one discharge passage for aligning the passed clip parts in a line and discharging said parts; and
   at least one swingable plate swingably held inside said part-holding chamber and having a distal end portion passing over said at least one gate port, said swingable plate being swung to urge any chip part halted at said at least one gate port due to an abnormal orientation toward a direction different from a direction in which the chip parts are discharged, thereby removing clogging.

2. The part-aligning apparatus of claim 1, wherein said at least one swingable plate is shaped into a sector and is swung through an angle that is so set that a rear edge of said sector does not pass over said at least one gate port.

3. The part-aligning apparatus of claim 2, wherein the angle through which said at least one swingable plate is permitted to swing is about 90°.

4. The part-aligning apparatus of claim 2, wherein the angle between a front edge and the rear edge of the sector is about 215°.

5. The part-aligning apparatus of claim 1, wherein an inclined surface for causing the chip parts to slide toward said at least one chute groove is formed in at least one side surface of said part-holding chamber.

6. The part-aligning apparatus of claim 5, wherein both side surfaces of said part-holding chamber are inclined.

7. The part-aligning apparatus of claim 5, wherein said at least one swingable plate also includes an inclined surface at its distal end portion.

8. The part-aligning apparatus of claim 1, wherein:
said part-holding chamber comprises a drum body and a cover portion;
said at least one chute groove is formed by an arc-shaped groove created in the inner surface of said drum body;
said at least one discharge passage is formed tangent to said arc-shaped chute groove; and
said at least one gate port is formed at the junction of said at least one chute groove and said at least one discharge passage.

9. The part-aligning apparatus of claim 1, wherein:
said at least one chute groove comprises at least two chute grooves formed in parallel in the inner surface of said part-holding chamber;
said at least one gate port comprises at least two gate ports formed at the lower ends of said at least two respective chute grooves; and
said at least one discharge passage comprises at least two discharge passages which both act to align the chip parts, coming out of said respective at least two gate ports, in a line for delivery.

10. The part-aligning apparatus of claim 1, wherein:
each of said chip parts has a length L greater than its height H and width W;
said at least one gate port has an opening having a width that is equal to the width of said at least one chute groove, and greater than said height H and width W of said chip parts, and less than said length L of said chip parts; and
said at least one gate port opening has a height that is greater than the height H and the width W, and less than the length L.

11. The part-aligning apparatus of claim 1, further including a motor for rotating said at least one swingable plate.

12. The part-aligning apparatus of claim 11, wherein said motor communicates its driving force to said at least one swingable plate via a belt and pulley mechanism.

13. The part-aligning apparatus of claim 12, wherein the belt and pulley mechanism comprises a driving pulley connected to a rotation shaft of the motor, and a follower pulley which is connected to said at least one swingable plate via another shaft, wherein a belt connects said driving pulley and said follower pulley.

14. A method of aligning chip parts, comprising the steps of:
causing said chip parts to slide into a chute groove;
orienting said chip parts in a given direction and causing said chip parts to slide downward within said chute groove;
passing said sliding chip parts through a gate port in succession;
aligning said passed chip parts in a row and delivering said chip parts; and
urging any chip part halted in said gate port due to an abnormal orientation toward a direction different from a direction in which said chip parts are delivered, by a swinging movement of a swingable member, thereby removing clogging.

15. The method of claim 14, wherein:
said urging step comprises rotating said swingable member such that a distal portion thereof engages said any chip part which has halted in the gate port, and thereby dislodges said any halted chip part from said gate port.

16. The method of claim 14, further comprising the step of, after dislodging any halted chip part, moving said swingable member in the direction in which said chip parts are delivered.

* * * * *